United States Patent [19]

Buhler et al.

[11] Patent Number: 4,862,113
[45] Date of Patent: Aug. 29, 1989

[54] SINUSOIDAL OSCILLATOR WITH INSTANT START-UP

[75] Inventors: Otto R. Buhler, Boulder; Brian A. Simpson, Niwot; John C. Twombly, Longmont, all of Colo.

[73] Assignee: International Business Machines Corporation, Armonk, N.Y.

[21] Appl. No.: 141,433

[22] Filed: Jan. 6, 1988

[51] Int. Cl.$^4$ .......................................... H03B 5/12
[52] U.S. Cl. ................................. 331/117 R; 331/173
[58] Field of Search ............. 331/173, 117 R, 117 FE, 331/167–171

[56] References Cited

U.S. PATENT DOCUMENTS

| 3,229,227 | 1/1966 | Popodi | 331/117 R |
| 3,363,198 | 1/1968 | Davies | 331/117 R |
| 3,646,477 | 2/1972 | Goodall | 331/117 R |
| 3,991,388 | 11/1976 | Harshbarger | 331/117 R |
| 4,272,736 | 6/1981 | Gercekci et al. | 331/173 X |
| 4,533,881 | 8/1985 | Monett | 331/36 C |
| 4,543,527 | 9/1985 | Schuchmann et al. | 324/207 |
| 4,617,534 | 10/1986 | Lill | 331/117 R |

Primary Examiner—Siegfried H. Grimm
Attorney, Agent, or Firm—Earl C. Hancock; Charles E. Rohrer

[57] ABSTRACT

Initial start up conditions for an oscillator having an inductor and capacitor coupled as a frequency determining resonant circuit are established by current generators. The current levels correlate to the steady state operating levels of the oscillator. Switching elements are actuated so as to gate the oscillator into immediate steady state operation without start up transient distortion by reconfiguring the relationship of the current sources to the oscillator elements.

4 Claims, 2 Drawing Sheets

SINUSOIDAL OSCILLATOR WITH INSTANT START-UP

TECHNICAL FIELD

The present invention relates to gated oscillator circuits. More particularly, the present invention relates to circuits for producing sinusoidal oscillations as an output signal in response to discrete gating input pulses. This invention is especially useful for applications wherein it is important to avoid output frequency and amplitude variations upon gating the oscillator on and off and/or for applications demanding a steady output frequency and amplitude by the oscillator circuit from the instant it is turned on to the instant it is turned off.

BACKGROUND OF THE INVENTION

Sinusoidal oscillators consist of two basic parts, a passive filter and an amplifier. The passive filter determines the frequency of operation of the circuit. The amplifier imparts energy into the filter as needed to sustain oscillations. The amplifier gain is sufficient for oscillation to commence and build up until non-linearities limit the amplitude. The oscillator circuit is usually designed so that the amplifier has minimal effect on the frequency of operation.

The problem with sinusoidal oscillators is that when the amplifier is initially turned on, the onset and build up of oscillation occurs gradually. Many cycles are required before steady state operation is reached. For some applications, this condition is acceptable, but for others such frequency and amplitude variations are intolerable.

For example, high speed printers use an oscillator in the printhead to clock pel signals. Problems occur when either the page-per-minute rate or the pel-per-inch rate becomes so high that a clock rate from a standard oscillator is not sufficient. That is, the clock rate is insufficient if there is too great a transient period in the start up or in the noise factor that creates a variable period between clock pulses. If the oscillator is instantly started at the beginning of a scan, pel placement accuracy and system response time are both improved.

Various prior art circuits have addressed improvement in the stabilization of start up frequencies for oscillators. One approach is to store the tank energy at the time of gate sampling for reapplication on start up. U.S. Pat. No. 3,646,477 by Goodall shows such a circuit.

Yet another approach is to expedite charging of the tank circuit when the circuit is turned on and/or to enhance collapse of the tank circuit oscillations when it is turned off. This is the approach followed in U.S. Pat. Nos. 3,991,388 by Harshbarger, 3,363,198 by Davies and 4,543,527 by Schuchmann et al.

U.S. Pat. No. 3,229,227 by Popodi is concerned with reducing transient effects on oscillator start up and shut down in response to gating pulses. The circuit establishes current conditions so that each initial output pulse of the oscillator starts at the same magnitude of voltage; namely, the peak voltage of the inductor element.

None of the prior art teaches start up and stopping of an oscillator circuit so that the passive filter constantly functions at steady state conditions.

DISCLOSURE OF THE INVENTION

The present invention is a method and apparatus for stable gating of an oscillator circuit that has a resonant network for determining the predominant operating frequency of the oscillator. This passive filter of this resonant circuit includes an inductive element and a capacitance element. A gate signal generator produces a two-level output. In response to one level, the invention maintains current flow through the inductive element at the same maximum peak amplitude that flows through the inductor during stable oscillator operation. By so doing, the present invention makes it possible to immediately commence oscillator operation at its normal, stable frequency when the gate changes from the first to the second level.

Further, the present invention allows cessation of oscillation at the stable, normal circuit frequency by responding to the shift of the gate back to the first level from the second level by causing the resonant network to cease oscillation at a point where the current through the inductive element is at its normal peak level.

Those having normal skill in the art will recognize the foregoing and other objects, features, advantages and applications of the present invention from the following more detailed descriptions of the preferred embodiment as illustrated in the accompanying drawings.

DETAILED DESCRIPTION OF THE PREFERRED EMBODIMENT

Figure 1:
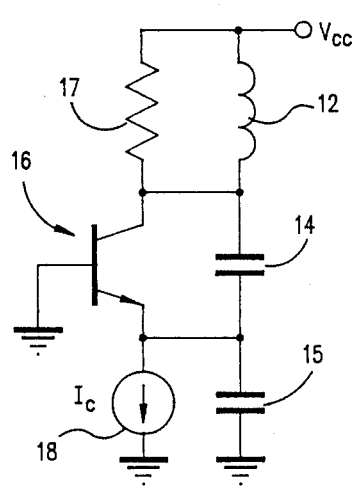
FIG. 1 is a contemporary Colpitts oscillator.

A contemporary version of a transistorized Colpitts oscillator is shown in FIG. 1. The passive filter is a tuned inductor and capacitor (L-C) network consisting of inductor 12 and capacitors 14 and 15. The gain of transistor amplifier 16 is sufficient to sustain oscillation while non-linearities limit the amplitude. Current source 18 produces current Ic which sets the quiescent current for transistor 16. By controlling the path of Ic, the oscillator is switched on and off.

Figure 2:
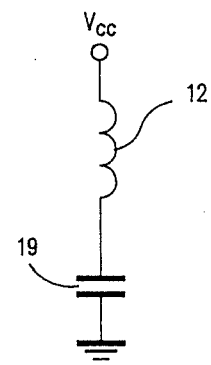
FIG. 2 is an equivalent circuit to the passive filter section of the FIG. 1 oscillator.

Steady state behavior of the oscillator is best understood by examining a simplified version of the filter as shown in FIG. 2. Inductor 12 is the same as in FIG. 1, but capacitor 19 is the equivalent of a series combination of capacitors 14 and 15. More precisely, capacitance 19 is the resultant of multiplying capacitances 14 and 15 and dividing by the sum of capacitances 14 and 15. The effect of transistor 16 loading the capacitors is neglected since this circuit is designed so that the transistor has little effect on oscillation besides sustaining it.

Figure 3:
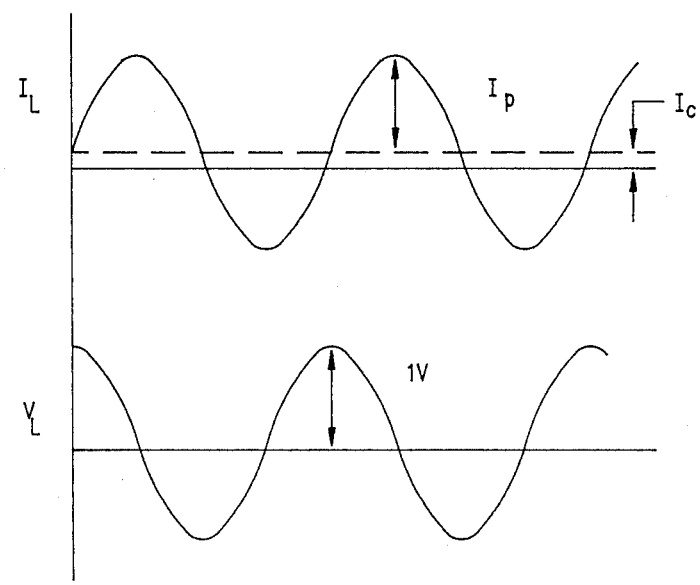
FIG. 3 is a time-based diagram of the voltage and current on the inductive element of FIG. 2 in normal, stable oscillation.

The frequency of oscillation W in radians per second is defined as 1 divided by the square root of the product of L and C. If the circuit is designed so that non-linearities limit the amplitude to one volt peak, then the peak inductor voltage is one volt and the peak inductor 12 current is defined as $Ip = 1/WL$ in addition to Ic. The relationship between the inductor current and the inductor voltage is shown in FIG. 3. Note that when the inductor current is at its peak, the inductor voltage is at 0 and the capacitor 19 voltage is at Vcc.

Figure 4:
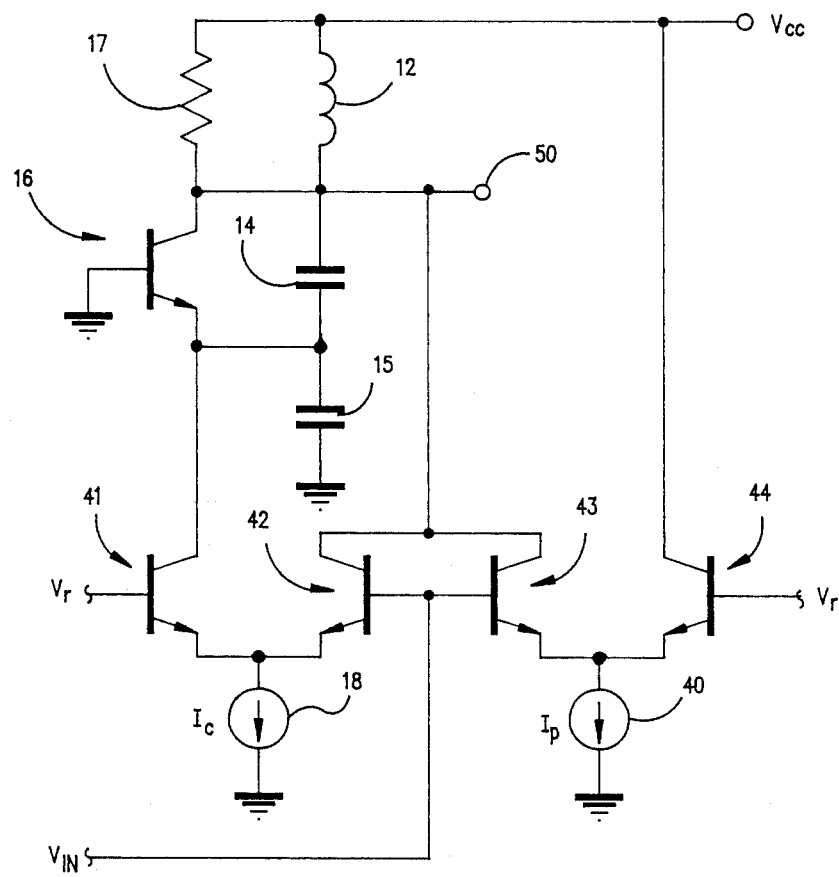
FIG. 4 is a Colpitts oscillator modified in accordance with this invention.

The key to instantly starting the oscillator in accordance with this invention is to release the filter from a selected point on the steady state cycle while simultaneously turning on transistor 16. A suitable release point, chosen from FIG. 3, is when the inductor current is at its peak and the inductor voltage is at zero. A circuit for accomplishing this is shown in FIG. 4 wherein elements having similar functions with FIG. 1 elements have common reference numbers.

When the gating voltage Vin is greater than reference voltage Vr, Ic and Ip flow through inductor 12 and the voltage across it is zero. No current flows through the Colpitts transistor 16; hence the oscillator is off.

When Vin is dropped below Vr, the Colpitts transistor 16 is turned on, Ic finds a new path through transistor 41, and current Ip from current source 40 is removed from inductor 12.

More specifically, with Vin less than Vr (Vin<Vr), transistors 41 and 44 conduct while transistors 42 and 43 are biased off. This isolates current source 40 and current Ip from the oscillator circuit while current Ic is coupled into the oscillator. Current Ic flows through the serially-coupled emitter to collector circuits of transistors 16 and 41, whereas Ip flows through the emitter to collector circuit of transistor 44. The result is oscillator operation substantially the same as FIG. 1 in its steady state. Conversely, whenever Vin is greater than Vr (Vin>Vr). Conversely, Ic and Ip flow through inductor 12 although the former is returned via transistor 42 while the latter returns through transistor 43.

At turn on, inductor 12 responds by driving its current into capacitors 14 and 15 and generating a voltage according to $V = L dI/dt$, just as it would if it were proceeding from that point during normal uninterrupted oscillation. Steady state operation commences immediately with little or no effect from switching transients. The sinusoidal oscillator thus described is instantly started into steady state operation by releasing the filter from initial conditions when the amplifier is turned on. This result is realized since the initial conditions are chosen from a point on the steady state operating cycle.

Figure 5:
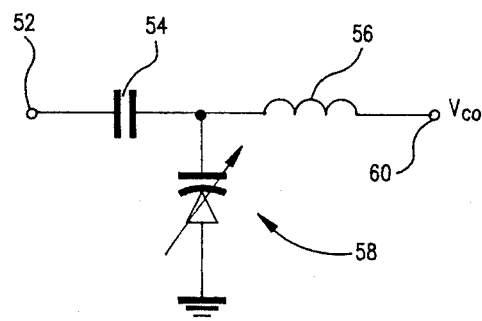
FIG. 5 shows a potential modification of the FIG. 4 circuit.

FIG. 5 illustrates a modification for the FIG. 4 circuit to produce an output signal Vco at terminal 60 with instant start-up capability. Output 50 of FIG. 4 is connected to input 52 of FIG. 5 for a T-network composed of capacitor 54, inductor 56 and varactor 58. Varactor 58 with proper control signal biasing is thus effectively added to the frequency determining capacitors 14 and 15 to produce the output signal with instant start-up capability.

When employed with a pel clocking oscillator for a high speed printer, the present invention is particularly useful in eliminating the transient period during start up. This allows accurate pel placement during the initial period of scan on each line. The circuit of this invention involves an L-C tank which, as an inherent feature, is much less noisy than multivibrators. Thus the circuit of the present invention helps reduce noise problems.

In the particular embodiment described, a Colpitts oscillator is shown using a transistor in a nonsaturating mode with an L-C tank establishing the operating frequency. In order to eliminate the transient period, current generators are used to create steady state conditions in the L-C tank while the oscillator is in the quiescent or off state. When the scan period is to start, the oscillator transistor is turned on while the currents flowing from the current generators are simultaneously rerouted enabling the oscillator to begin at steady state conditions.

Although the foregoing describes the exemplary preferred embodiment in relatively specific detail, those having normal skill in the art will recognize various changes, modifications, additions and applications other than those specifically mentioned herein without departing from the spirit of this invention.

What is claimed is:

1. Apparatus for immediately initiating operation of an oscillator in a stable frequency mode wherein the oscillator is composed of an amplifier section and a passive filter section with the filter section including an inductive element and a capacitive element comprising:

current source generating means for producing an output current corresponding to the peak current through the oscillator inductive element during stable operation of the oscillator;

switching means responsive to signals introduced to an input thereof for shifting between first and second conducting states;

means coupling said current source generating means output through said switching means to the inductive element of the oscillator when said switching means is in its first conducting state and the oscillator amplifier section is off while removing said current source generating means from the oscillator inductive element when said switching means is in said second conducting state and the oscillator amplifier section is on; and control means introducing first and second signal levels to said switching means input for causing said switching means to assume a respective said first and second conducting state.

2. Apparatus in accordance with claim 1 wherein said switching means includes means for turning the oscillator amplifier section off when said switching means is in said first conducting state, and for turning the oscillator amplifier section on when said switching means is in said second conducting state.

3. Apparatus for switching an oscillator between non-oscillating and stable oscillating states wherein the oscillator includes a frequency determining resonant network having an inductive element and a capacitive element coupled in series, an energy source and an amplifier transistor for connecting the energy source to the resonant network, said apparatus comprising:

a source of current having an amplitude correlated to the amplitude of the peak current flowing through the inductive element when the oscillator is in its stable oscillating state;

first and second transistor pairs responsive to signals at the inputs thereof to concurrently assume first and second conducting states, said first transistor pair being arranged for coupling the oscillator energy source to the oscillator inductive element hen in said first conducting state and for coupling the oscillator energy source to the oscillator amplifier transistor when in said second conducting state, said second transistor pair being arranged for coupling said current source to the oscillator inductive element when in said first conducting state and for isolating said current source from the oscillator inductive element when in said second conducting state; and means introducing common control signals to said first and second transistor pair inputs for selectively causing said transistor pairs to assume common said conducting states.

4. A method of controlling an oscillator which has a passive filter section including an inductor and an amplifier section for applying energy to the filter section comprising the steps of:

generating a gating signal which has a duration corresponding to the intended operating period for the oscillator;

enabling the oscillator amplifier section to apply energy to the filter section so as to cause the oscillator to operate in its normal oscillatory mode in response to said gating signal from said generating step;

disabling the oscillator amplifier section from applying energy to the filter section in the absence of said gating signal;

producing a current flow of a magnitude corresponding to the magnitude of current flow through the oscillator inductor when the oscillator is operating in its frequency stable oscillating mode;

driving said produced current flow through the oscillator inductor whenever the oscillator is operating in response to said disabling step; and switching said produced current flow from the oscillator inductor to a load circuit isolated from said oscillator inductor whenever the oscillator amplifier section is operating in response to said enabling step.

* * * * *